United States Patent [19]

Tiku

[11] Patent Number: 4,632,713
[45] Date of Patent: Dec. 30, 1986

[54] PROCESS OF MAKING SCHOTTKY BARRIER DEVICES FORMED BY DIFFUSION BEFORE CONTACTING

[75] Inventor: Shiban K. Tiku, Richardson, Tex.

[73] Assignee: Texas Instruments Incorporated, Dallas, Tex.

[21] Appl. No.: 761,219

[22] Filed: Jul. 31, 1985

[51] Int. Cl.⁴ .......................................... H01L 21/225
[52] U.S. Cl. ...................................... 148/188; 29/571; 29/591; 357/15
[58] Field of Search ................... 148/188; 29/591, 571; 357/15 M

[56] References Cited

U.S. PATENT DOCUMENTS

| | | | |
|---|---|---|---|
| 3,820,235 | 6/1974 | Goldman | 29/578 |
| 3,907,617 | 9/1975 | Zwernemann | 148/188 |
| 3,938,243 | 2/1976 | Rosvold | 29/578 |
| 4,186,410 | 1/1980 | Cho et al. | 29/571 X |
| 4,265,934 | 5/1981 | Ladd | 29/571 X |
| 4,332,076 | 1/1982 | de Zaldivar | 29/571 |
| 4,389,768 | 6/1983 | Fowler et al. | 148/188 X |
| 4,414,737 | 11/1983 | Menjo et al. | 148/188 X |
| 4,434,013 | 2/1984 | Bol | 29/571 X |
| 4,485,550 | 12/1984 | Koeneke | 29/571 |
| 4,545,824 | 10/1985 | Salvi et al. | 148/187 X |
| 4,569,119 | 2/1986 | Terada et al. | 29/571 |
| 4,586,968 | 5/1986 | Coello-Vera | 148/188 |

Primary Examiner—George T. Ozaki
Attorney, Agent, or Firm—Carlton H. Hoel; James T. Comfort; Melvin Sharp

[57] ABSTRACT

Increased barrier heights at metal(36)-semiconductor(32) contacts for semiconductors such as gallium arsenide by formation of an opposite doping type thin layer (34) on the semiconductor (32) surface by surface diffusion of dopants are disclosed. Preferred embodiments diffuse zinc 50 to 400 Å into n type gallium arsenide (32) by rapid thermal pulses; then aluminum or titanium-platinum (36) contacts to the zinc doped layer (34) are deposited by evaporation and lift off.

7 Claims, 9 Drawing Figures

PROCESS OF MAKING SCHOTTKY BARRIER DEVICES FORMED BY DIFFUSION BEFORE CONTACTING

BACKGROUND OF THE INVENTION

The present invention relates to electronic semiconductor devices, and, more particularly, to Schottky barriers with gallium arsenide and related semiconductors.

The contact between a metal and a semiconductor creates an electrical barrier at the interface (Schottky barrier), and the barrier height depends on factors such as the work functions of the metal and semiconductor, doping level of the semiconductor, surface state density, and so forth; see, generally, Sze, Physics of Semiconductor Devices, ch.5 (John Wiley and Sons, 2d Ed, 1981). In low power logic circuits based on normally-off (enhancement mode) MESFETs, a positive voltage must be applied to the gate electrode to turn on the device (that is, the built in voltage of the gate-channel interface is large enough to deplete the channel with no applied gate voltage). But the gate voltage is limited roughly to a few kT below the barrier height in order to limit gate current (about 0.6 V for titanium-platinum gates on gallium arsenide); and this limits the possible logic swing and noise margin of the logic circuits. Thus it is necessary to have a large barrier height in order to have a large logic swing which is important for noise immunity.

However, for III-V semiconductors such as gallium arsenide, gallium antimonide, and indium phosphide the metal-semiconductor interfaces have barrier heights essentially independent of the metal's work function due to a pinning of the Fermi level by the semiconductor's surface states. For example, gallium arsenide forms contacts with metals such as platinum, palladium, aluminum, and tungsten that all have a barrier height of about 0.8 V; and this barrier height is too low for good enhancement mode MESFETs. Thus it is a problem to increase the barrier heights of metal contacts with gallium arsenide and similar semiconductors.

Attempts have been made to vary barrier heights in metal-semiconductor contacts, such as by varying doping concentration, but only barrier height lowering results. Also, the use of a thin insulator raises the effective barrier height, but the resulting diodes are non-ideal as the probability of tunneling through the isulator depends strongly on the applied voltage. A known technique of increasing the barrier height of a metal-semiconductor contact is insertion of a thin layer of oppositely doped semiconductor between the metal and the semiconductor. For example, if a layer 100 Å thick of p+ silicon is inserted between nickel and n type silicon (such as by implantation of antimony followed by annealing prior to deposition of the nickel), then the barrier height increases approximately linearly with the antimony dose; see J. Shannon, Control of Schottky Barrier Height Using Highly Doped Surface Layers, 19 Solid State Electronics 537 (1976). However, these techniques have had limited success due to the lack of control of the metal-semiconductor interface, and the lack of control over the doping concentration and the abruptness of the junction.

These limitations may be overcome by the use of molecular beam epitaxy (MBE). For example, Eglash et al, 22 Jpn.J.Appl.Phys.Suppl. 431 (1983), grew layers of p+ type gallium arsenide with thicknesses in the range of 50 to 360 Å and doped with acceptor concentrations in the range of $1 \times 10^{18}$ to $1 \times 10^{20}$ per $cm^3$ on n type gallium arsenide (donor concentrations $5 \times 10^{16}$ per $cm^3$) and contacted the p+ layer with aluminum; the barrier height was raised from 0.79 V to 1.24 V.

But MBE is a relatively slow and expensive process to form the thin, oppositely doped layer and not adapted to high throughput, and implantation of p type dopants such as zinc and beryllium in gallium arsenide to form the thin oppositely doped layer fails due to the rapid diffusion of the dopants during the anneal subsequent to the implantation. Thus it is a problem of the known barrier height raising techniques to achieve simple processing steps with high throughput.

SUMMARY OF THE INVENTION

The present invention provides metal-semiconductor contacts with increased barrier heights and methods of fabrication which utilize a rapid thermal diffusion of dopants from the surface of the semiconductor to form a thin layer of conductivity type opposite that of the semiconductor bulk. The formation of the thin layer is followed by the metal contact formation on the thin layer. Preferred embodiments include gallium arsenide and indium phosphide as the semiconductor; zinc as the diffusing dopant; and titanium-platinum and aluminum as the metal. The increased barrier heights are obtained with a reproducible and simple process and solve the problems of the known barrier height increase techniques.

DESCRIPTION OF THE PREFERRED EMBODIMENTS

Figure 1:
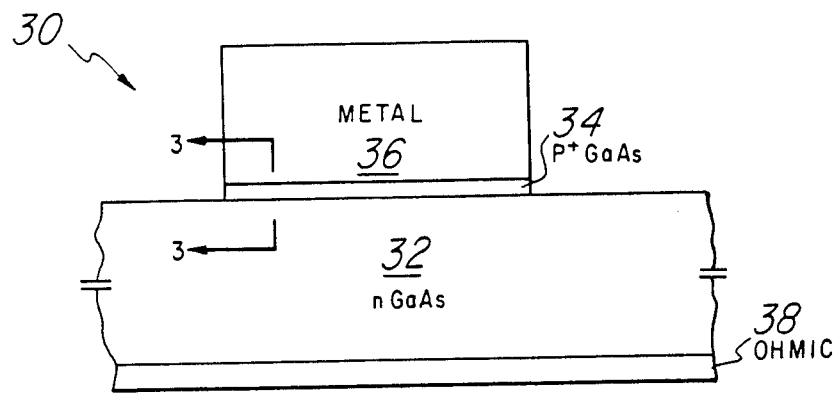
FIG. 1 illustrates in schematic cross sectional elevation view a first preferred embodiment Schottky diode fabricated by a first preferred embodiment method.

FIG. 1 illustrates in schematic cross sectional elevation view a first preferred embodiment Schottky diode, generally denoted 30, which includes n type gallium arsenide substrate 32, thin p+ gallium arsenide layer 34, metal layer 36, and ohmic contact 38. To describe the features and operation of diode 30 we begin with a consideration of the band structure of Schottky diodes.

Figure 2A:
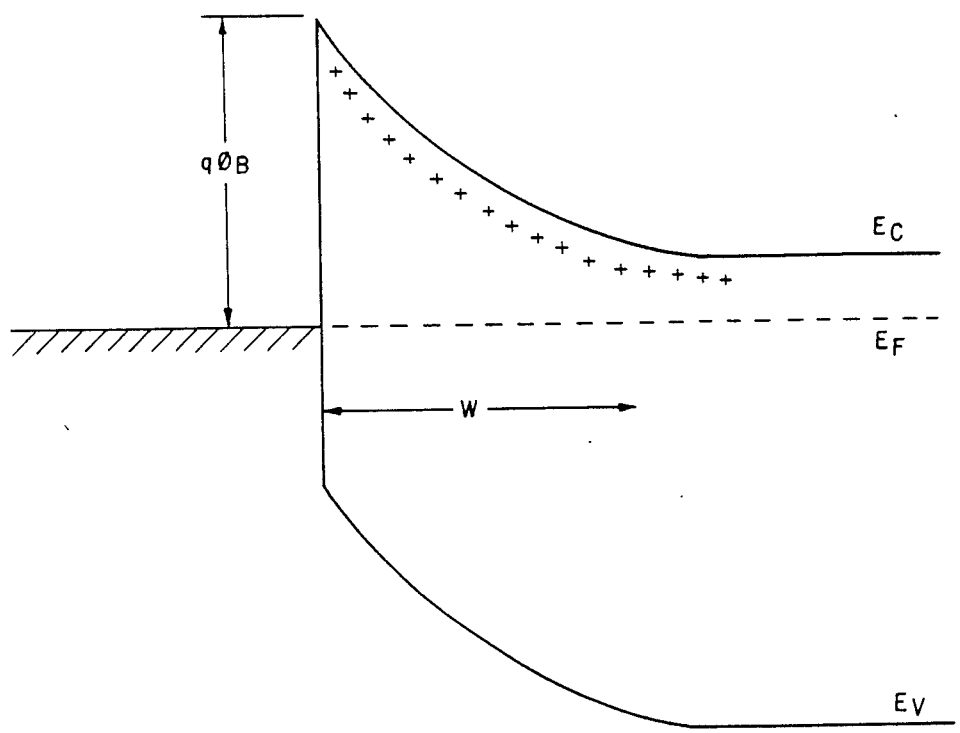
FIGS. 2A-B illustrate the conduction and valence band edges for ideal and high surface state density metal-semiconductor contacts, respectively, for n type semiconductor.

FIG. 2A illustrates the conduction and valence band edges and Fermi level for an ideal metal-semiconductor contact for n type semiconductor; the left hand portion of the figure represents metal and the right hand portion n type semiconductor with an electron affinity less than the work function of the metal. Note that the work function for aluminum is about 4.25 eV and the electron affinity for gallium arsenide is 4.07 eV, and this relationship between the work function and electron affinity is not atypical. The barrier height of the contact $q\phi_B$ is given by $$q\phi_B = q\phi_m - q\chi$$

where $q\phi_m$ is the metal's work function and $q\chi$ is the semiconductor's electron affinity. Note that a negative charge builds up on the metal surface and a corresponding positive charge is uncovered in the depletion layer in the semiconductor; the depletion layer depth is denoted W and the uncovered charge suggested by the + symbols in FIG. 2A. Note for p type semiconductor the barrier height is $$q\phi_B = E_g - (q\phi_m - q\chi)$$

where $E_g$ is the bandgap of the semiconductor.

Figure 2B:
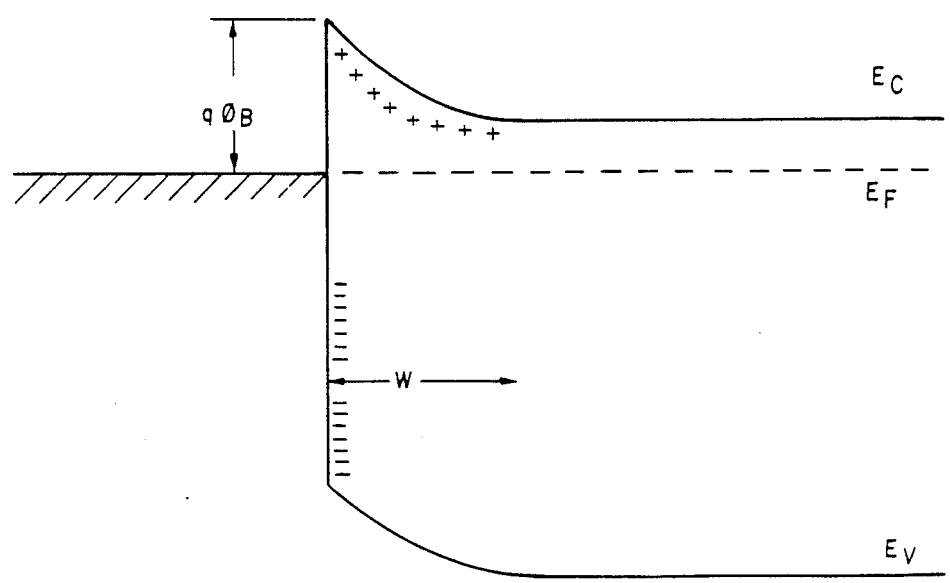

Groups III-V semiconductors such as gallium arsenide have high surface state densities at a metal-semiconductor contact; and the effect of surface states on the barrier height is illustrated in FIG. 2B. Essentially, upon formation of the contact acceptor surface states have been emptied to partially neutralize the negative charge on the metal surface; and thus the depletion layer depth W is decreased and the barrier height lowered.

Figure 3:
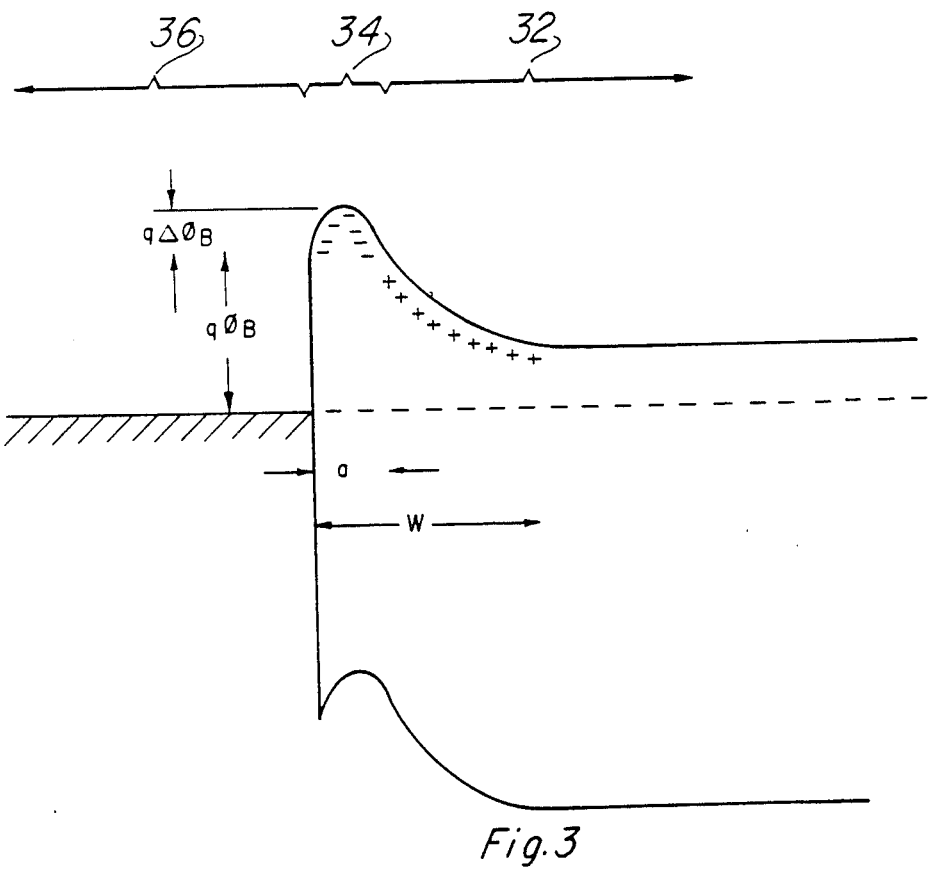
FIG. 3 illustrates the conduction and valence band edges of a metal-semiconductor contact for n type semiconductor with a thin p+ type semiconductor layer between the metal and the n type semiconductor.

FIG. 3 illustrates the conduction and valance band edges for device 30 along line 3—3 of FIG. 1. The original barrier height $q\phi_B$ for a direct contact between metal 36 and substrate 32 and the increase of barrier height $q\Delta\phi_B$ due to the p+ layer 34 are both indicated. Layer 34 is essentially fully depleted at thermal equilibrium, and the negative space charge from the acceptors causes the negative curvature of the band edges. This depletion of layer 34 also insures that the junction of layer 34 and substrate 32 does not behave as a p-n junction, and device 30 behaves as a true Schottky diode.

The increase in barrier height can be theoretically approximated as $qN_p a^2/\epsilon_s$, where $N_p$ is the doping concentration in layer 34, $a$ is the thickness of layer 34, and $\epsilon_s$ is the permittivity of the semiconductor, if $N_p >> N_n$ and $aN_p >> WN_n$ where $N_n$ is the doping concentration in substrate 32 and W is the width of the depletion region.

Figure 4A:
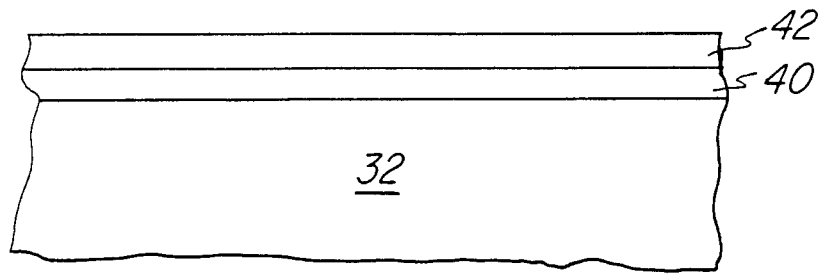
FIGS. 4A-C illustrate process steps in the first preferred embodiment method of fabrication.
Figure 4B:
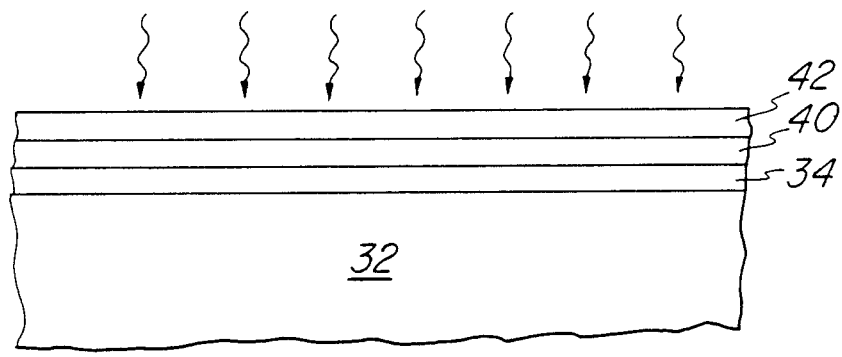
Figure 4C:
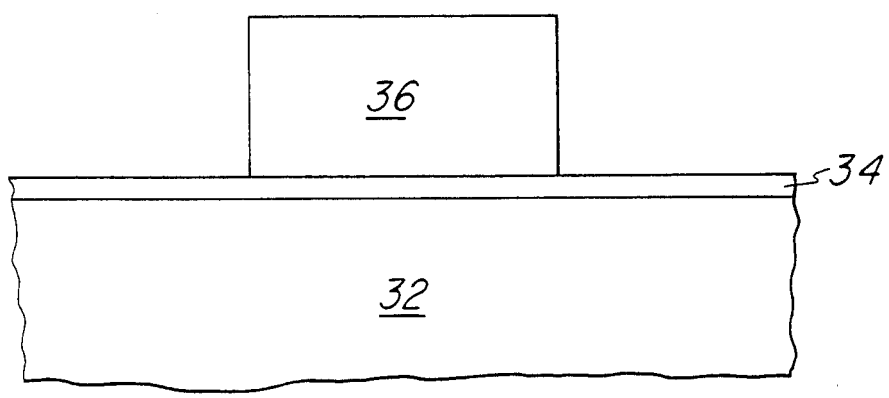

Further characteristics of the features and operation of device 30 can best be discussed by consideration of the following first preferred embodiment method of fabrication. The steps of the method are illustrated in FIGS. 4A-C.

(a) A 200 Å thick layer 40 of twenty percent zinc oxide and eighty percent silicon dioxide is sputter deposited on a (100)-oriented crystal of gallium arsenide 32 which has been silicon doped n type to a carrier concentration of $1 \times 10^{18}$ per cm$^3$. Layer 40 is capped with a 500 Å thick layer 42 of silicon nitride deposited by plasma enhanced CVD; see FIG. 4A.

Figure 5:
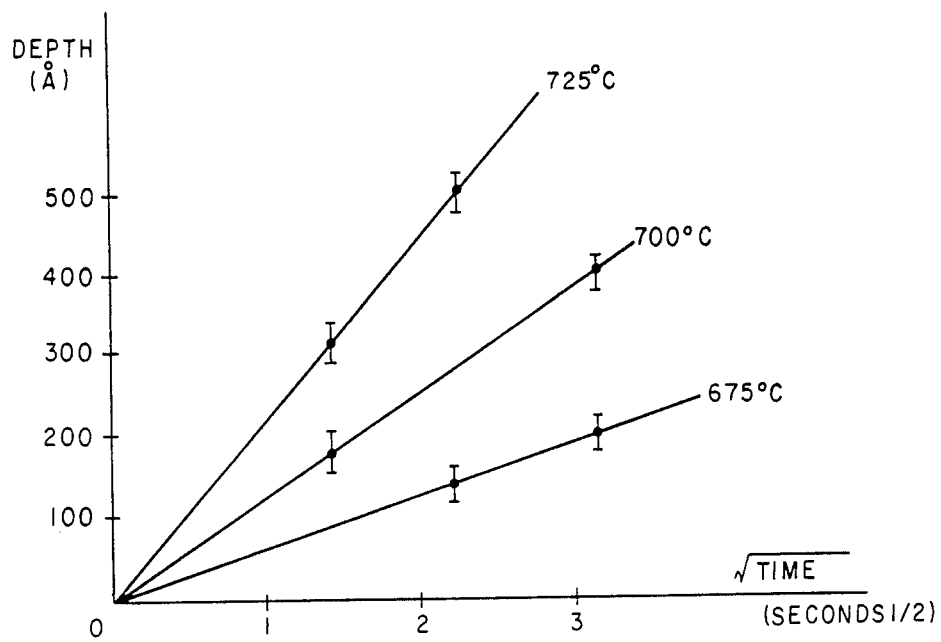
FIG. 5 illustrates the temperature and time dependence of the diffusion step of the first preferred embodiment method.

(b) An optical annealer is used to raise the temperature of layer 40 to about 700° C. for two seconds. This thermal pulse drives zinc from layer 40 into substrate 32 to depths of about 175 Å and forms layer 34; see FIG. 4B. The resulting doping concentration in layer 34 is about $1 \times 10^{19}$ carriers per cm$^3$. Also, FIG. 5 illustrates the depth of diffusion of the zinc as a function of the temperature and duration of the thermal pulse. Note that the depth is roughly proportional to the square root of the pulse duration and increases rapidly with temperature. Also, note that the zinc diffuses rapidly at a fairly low temperature and forms a sharp junction.

(c) Nitride 42 and oxides 40 are stripped to expose layer 34. Then photoresist is deposited on layer 34 and patterned to define active areas about ten microns square. Next, aluminum is sputter deposited onto the patterned photoresist and layer 34 to a thickness of 3,000 Å, and lifted off with the photoresist to form dots 36 about ten microns square. See FIG. 4C.

(d) The aluminum dots 36 are used as a mask for plasma etching layer 34; an overetch that removes a little of substrate 32 will not affect device performance because this is outside of the active area. Lastly, a gold-germanium ohmic contact is made to the remote side of substrate 32 to complete device 30.

Device 30 showed a barrier height of about 1.0 eV, whereas comparable devices without the p+ layer 34 have a barrier height of about 0.75 eV. The measurement of barrier height was computed from the standard exponential dependence of the current on voltage which yields:

$$\phi_B = \frac{kT}{q} \ln\left(\frac{A''T^2}{J_s}\right).$$

$A''$ is the effective Richardson constant and $J_s$ is the saturation current at zero voltage. Note that the value of $\phi_B$ only increases 18 meV at room temperature for a doubling of $A''$ and is not sensitive to the value of $A''$. Also, the ideality factor for device 30 has been computed from the current-voltage data and is close to 1 and not 2, which indicates the absence of junction recombination current. Further, the leakage currents in the forward direction are small, so MESFET gates with the structure of device 30 are feasible.

FIG. 5 illustrates the thickness of layer 34 for various temperature and time conditions for the thermal pulse that diffuses the zinc into substrate 32. In particular, temperatures of 675°, 700°, and 725° C. and times of two to ten seconds have yielded thicknesses of 100 to over 500 Å. Thicknesses over about 400 Å for layer 34 lead to junction recombination effects. Devices similar to device 30 but fabricated with the foregoing temperature and time conditions have shown a range of barrier heights from 0.75 to 1.2 eV.

Figure 6:
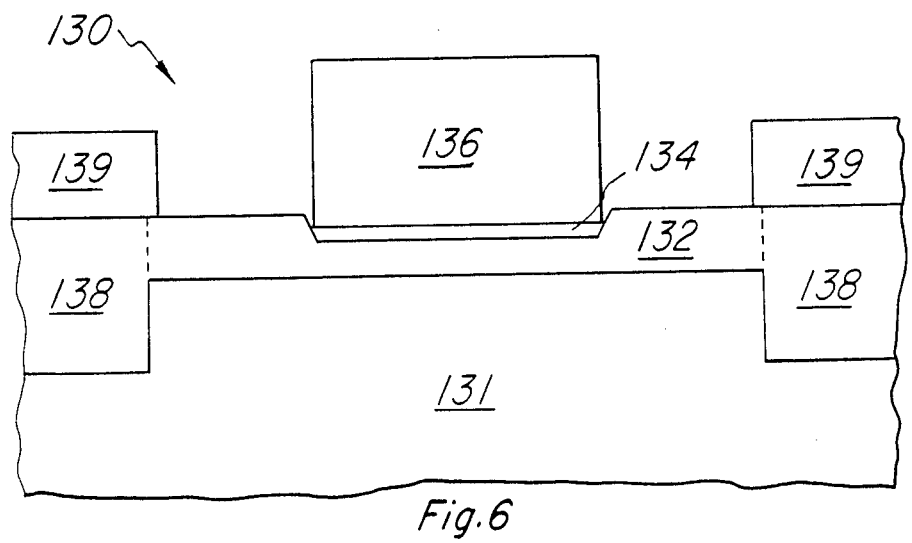
FIG. 6 is a cross sectional elevational view of a slice along the channel of a MESFET with a first preferred embodiment gate.

FIG. 6 is a schematic cross sectional elevation view of enhancement mode MESFET 130 with a barrier height increasing layer, and includes semi-insulating gallium arsenide substrate 131, n type gallium arsenide channel 132, p+ type gallium arsenide barrier height increasing layer 134, titanium-platinum gate 136, n+ type gallium arsenide source and drain regions 138, and source and drain germanium-gold ohmic contacts 139. Channel 132 is about 0.1 micron thick and barrier height increasing layer 134 about 100 Å thick.

MODIFICATIONS AND ADVANTAGES

Various modifications of the preferred embodiment devices and methods may be made while retaining the simple barrier raising feature of the devices and methods. In particular, the dimensions and geometrical shapes of the device components may be varied, for example, the thickness of the barrier height increasing layer may vary from negligible to thickness that shows the onset of junction behavior. Concurrently, the doping level of the barrier height increasing layer may be varied to adjust the barrier height, the range of doping levels available depends upon the layer thickness.

Many variations of the materials are possible, for example, indium gallium arsenide, indium phosphide, or other III-V systems including quarternary or higher alloys will be analogous to gallium arsenide; note that II-VI systems such as mercury cadmium telluride may be heat sensitive and that silicon does not have serious Fermi level pinning.

Similarly, titanium, platinum, and other metals and alloys may be used for the gate; and zinc, beryllium, and magnesium may be used for the p type dopant on n type gallium arsenide, and sulfur, tin, selenium, and tellerium for n type dopant on p type gallium arsenide. Other fast diffusing materials may be useful as dopants.

Superlattices and heterojunctions can be substituted for the epilayers generally, for HEMT logic with enhancement mode operation.

Advantages of rapid thermal diffusion for the barrier height raising layer formation include the simple processing steps, adjustability of layer characteristics by process parameter adjustment, and compatibility with standard processing steps.

I claim:

1. A method of raising the barrier height of a metal-semiconductor contact wherein said semiconductor is doped a first conductivity type, comprising the steps of:
   (a) forming a thin layer of a conductivity type opposite said first type on said semiconductor by rapid thermal diffusion of dopant from a surface of said semiconductor; and
   (b) depositing said metal on said thin layer to form said contact.
2. The method of claim 1, wherein:
   (a) said semiconductor is a compound of elements from groups III and V of the periodic table.
3. The method of claim 2, wherein:
   (a) said semiconductor is gallium arsenide.
4. The method of claim 1, wherein:
   (a) said dopant is zinc.
5. The method of claim 4, wherein:
   (a) said zinc is supplied by a mixture containing zinc oxide deposited on said surface.
6. The method of claim 1, wherein:
   (a) said first conductivity type is n type; and
   (b) said dopant is selected from the group consisting of zinc, beryllium, and magnesium.
7. The method of claim 1, wherein:
   (a) said first conductivity type is p type; and
   (b) said dopant is selected form the group consisting of sulfur, tin, selenium, and tellurium.

* * * * *